(12) United States Patent
Baenisch

(10) Patent No.: US 11,921,666 B2
(45) Date of Patent: Mar. 5, 2024

(54) METHOD FOR MIPI RFFE ADDRESS ASSIGNMENT AND MIPI RFFE DEVICE

(71) Applicant: Infineon Technologies AG, Neubiberg (DE)

(72) Inventor: Andreas Baenisch, Gruenwald (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/649,953

(22) Filed: Feb. 4, 2022

(65) Prior Publication Data
US 2022/0269643 A1 Aug. 25, 2022

(30) Foreign Application Priority Data

Feb. 19, 2021 (EP) .................................... 21158084

(51) Int. Cl.
*G06F 13/42* (2006.01)
*G01R 19/00* (2006.01)
*G06F 13/40* (2006.01)
*H04B 1/18* (2006.01)
*H04B 1/40* (2015.01)

(52) U.S. Cl.
CPC ..... *G06F 13/4291* (2013.01); *G01R 19/0084* (2013.01); *G06F 13/4068* (2013.01); *H04B 1/18* (2013.01); *H04B 1/40* (2013.01); *G06F 2213/0052* (2013.01)

(58) Field of Classification Search
CPC ............ G06F 13/4291; G06F 13/4068; G01R 9/0084; H04B 1/18; H04B 1/40
See application file for complete search history.

(56) References Cited

U.S. PATENT DOCUMENTS

| | | | |
|---|---|---|---|
| 11,106,620 B1* | 8/2021 | Mishra | G06F 1/10 |
| 2009/0031048 A1* | 1/2009 | Richards | G06F 13/4072 710/3 |
| 2009/0182920 A1* | 7/2009 | Chao | G06F 12/0676 710/110 |
| 2013/0198427 A1* | 8/2013 | Leitner | G06F 13/404 710/110 |
| 2017/0077916 A1* | 3/2017 | Zhou | H03K 19/0175 |
| 2017/0212850 A1* | 7/2017 | Mishra | G06F 13/364 |
| 2018/0121384 A1 | 5/2018 | Podsiadlo et al. | |
| 2018/0260358 A1 | 9/2018 | Obkircher et al. | |
| 2019/0171588 A1* | 6/2019 | Mishra | G06F 13/387 |
| 2020/0160794 A1* | 5/2020 | Park | G09G 3/3291 |
| 2020/0373291 A1* | 11/2020 | Bakalski | H05K 9/0067 |

\* cited by examiner

*Primary Examiner* — Phong H Dang
(74) *Attorney, Agent, or Firm* — Slater Matsil, LLP

(57) ABSTRACT

A method includes detecting a voltage at a configuration terminal of a mobile industry processor interface (MIPI) radio frequency front end (RFFE) device with a timing based on a MIPI RFFE signal received by the MIPI RFFE device, and setting an address for the MIPI RFFE device based on the detected voltage.

20 Claims, 4 Drawing Sheets

METHOD FOR MIPI RFFE ADDRESS ASSIGNMENT AND MIPI RFFE DEVICE

This application claims the benefit of European Patent Application No. 21158084, filed on Feb. 19, 2021, which application is hereby incorporated herein by reference.

TECHNICAL FIELD

The present application relates to methods for MIPI RFFE address assignment and to corresponding MIPI RFFE devices.

BACKGROUND

The MIPI (mobile industry processor interface alliance) RFFE (radio frequency front end control interface), "MIPI RFFE", is a standardized interface widely used for control of radio frequency front end systems and is for example used in mobile phones. A MIPI RFFE system may include up to 15 slave devices and up to four master devices coupled to a bus instance, including power amplifiers, low noise amplifiers, filters and switches. The components coupled to a bus instance each need a unique address, referred to as USID, for communication via the bus instance.

The USID may be set by a manufacturer of a certain radio frequency device. However, this may lead to problems if two devices which are to be deployed for a single bus instance have the same USID configured, for example when two different devices of the same type having the same USID are to be used, or if two different devices happen to have the same USID by coincidence.

One approach to solve this problem would be to use a plurality of address pins for setting an address, individually fusing chips to set a specific address, or to manufacture the same device with different addresses. All these approaches add to the costs of the devices, which is not desirable.

SUMMARY

A device as defined in claim 1 and a method as defined in claim 14 are provided. The dependent claims define further embodiments.

According to an embodiment, a method of address assigning for a MIPI RFFE device is provided, comprising:

detecting a voltage at a configuration terminal of the MIPI RFFE device with a timing based on a MIPI signal received by the MIPI RFFE device, and setting the address of the MIPI RFFE device based on the detected voltage.

According to a further embodiment, a MIPI RFFE device is provided, including sense circuitry configured to:

determine a voltage at a configuration terminal of the MIPI device with a timing based on a MIPI RFFE signal received by the MIPI RFFE device, set an address of the MIPI RFFE device based on the detected voltage.

The above summary is merely a brief overview over some embodiments and is not to be construed as limiting.

DETAILED DESCRIPTION OF ILLUSTRATIVE EMBODIMENTS

In the following, various embodiments will be described in detail referring to the attached drawings. These embodiments are given by way of example only and are not to be construed as limiting. For example, while embodiments may be described including a plurality of features (for example components, elements, acts, events, steps etc.), in other embodiments, some of these features may be omitted, and/or may be replaced by alternative features. In addition to the features explicitly shown and described, further features may be provided. For example, embodiments discussed herein relate to address assignment to MIPI RFFE devices. Apart from the address assignment described, the MIPI RFFE devices may be implemented in a conventional manner, for example for communication after the address has been assigned and for performing various functions conventionally performed using MIPI devices, for example as power amplifiers, low noise amplifiers, antenna tuners, filters, switches or any other radio frequency devices in case of MIPI RFFE devices.

Features from various embodiments may be combined to form further embodiments. Variations or modifications described with respect to one of the embodiments may also be applied to other embodiments unless noted otherwise.

Connections or couplings described herein relate to electrical connections or couplings unless noted otherwise. Such connections or couplings may be modified, for example by adding components or by removing components, as long as the general function of the connection or coupling, for example to provide a certain kind of information, to transmit a voltage and/or current or the like, is essentially maintained.

Figure 1:
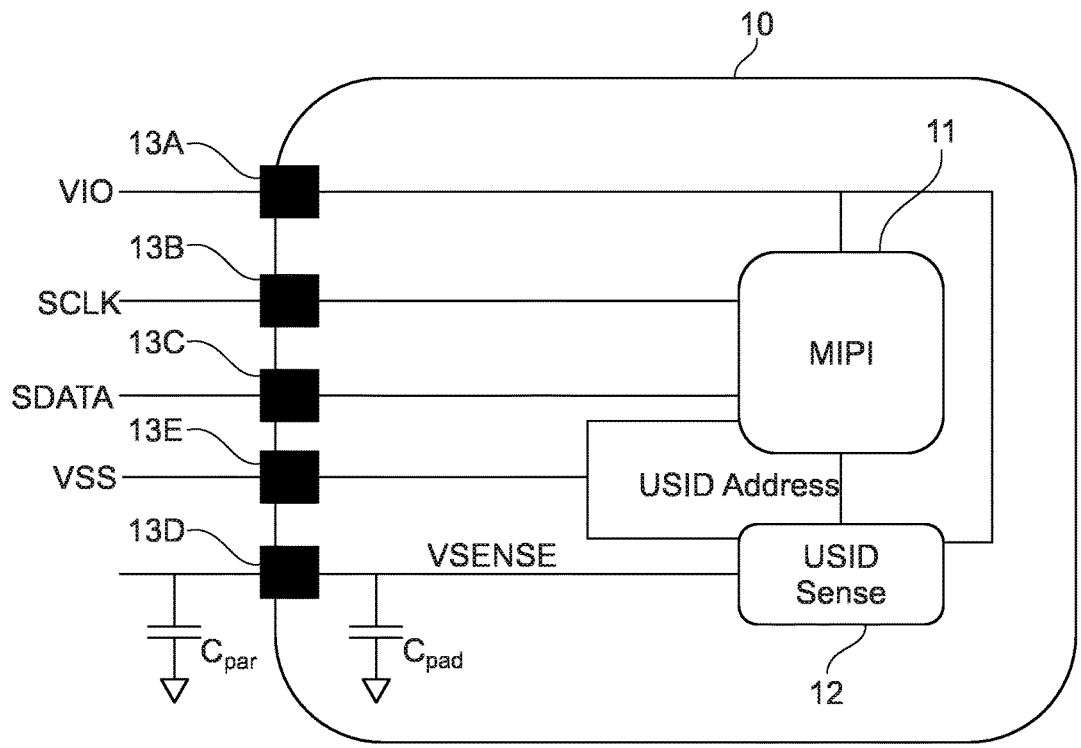
FIG. 1 is a block diagram of a device according to an embodiment.

FIG. 1 is a block diagram showing a MIPI device 10 according to an embodiment. The components of MIPI device 10 may be integrated on a single chip, or may for example be provided in different chips included in a same package.

MIPI device 10 includes a first terminal 13A configured to receive a supply voltage VIO, a fifth terminal 13E configured to receive VSS (or ground), VIO being a supply voltage with respect to VSS, a second terminal 13B configured to receive a MIPI RFFE clock signal SCLK, and a third terminal 13C configured to receive a MIPI RFFE data signal SDATA. Signals SDATA, SCLK are examples for MIPI RFFE signals as used herein.

Supply voltage VIO supplies components of device 10 with power. Clock signal SCLK and data signal SDATA serve for MIPI data communication, with a MIPI core ii of device 10. MIPI core 11 may receive and transmit data signals via terminal 13C, for example receive commands, clocked by clock signal SCLK, and perform any function device 10 is intended for, for example the functions discussed above like amplifier functions, tuning functions, switching functions etc. This may be implemented in any conventional manner. While MIPI core 11 is coupled to the three terminals 13A-13C, further terminals may be provided in device 10, depending on the function, for example terminals to be coupled to an antenna for tuning, terminals coupled to internal switches of MIPI core 11, terminals for receiving a signal and outputting an amplified signal etc.

Furthermore, device 10 includes a fourth terminal 13D, which is used for address configuration at start-up of MIPI RFFE device 10. A voltage VSENSE is applied to fourth terminal 13D in embodiments and detected by sense circuitry 12 to determine the address (USID) of device 10 to be used. In embodiments, as explained further below in more detail, VSENSE may take on more than two different levels, for example four different levels, to allow setting of four different addresses via a single terminal, namely fourth terminal 13D.

External parasitic capacitances $C_{par}$ and internal parasitic capacitances $C_{pad}$ related to terminal 13D may influence how far VSENSE reaches a sufficiently stable state at sense circuit 12 to allow reliable sensing. The time until VSENSE is sufficiently stable may also depend on how fast the supply voltage VIO rises at start-up. On the other hand, at start-up, according to the MIPI RFFE standard device 10 should be capable of receiving MIPI RFFE signals, already 120 ns after the supply voltage VIO has reached a predefined threshold value at start-up, such that a fast setting of the address of the device 10 is required. Embodiments as described below allow for a reliable detection and measurement of VSENSE at start-up of the device.

In embodiments, the timing for detecting voltage VSENSE is based on a MIPI RFFE signal, for example the first MIPI RFFE signal received at terminal 13C after start-up and/or clock signal SCLK received at terminal SCLK. For this timing, MIPI core 11 may give information about a MIPI RFFE signal (at terminal 13B and/or 13C) to sense circuitry 12, such that sense circuit 12 can base its sense timing thereon.

For example, the start of a sense period for detecting VSENSE, the end of the sense period for detecting VSENSE or both may be based on the MIPI RFFE signal. "Start of sense period" may refer to a point in time where internal nodes of sense circuit 12 are charged to threshold voltages for detecting VSENSE, while an internal sense node is charged to VSENSE. End of the sense period may refer to the point in time where the actual detecting occurs, for example where a voltage at the internal sense node is compared to the threshold voltages, based on which comparison then the address to be set is determined. Various examples for such a timing based on a MIPI RFFE signal received by MIPI RFFE device 10 or other devices according to embodiments will be discussed further below.

Figure 2:
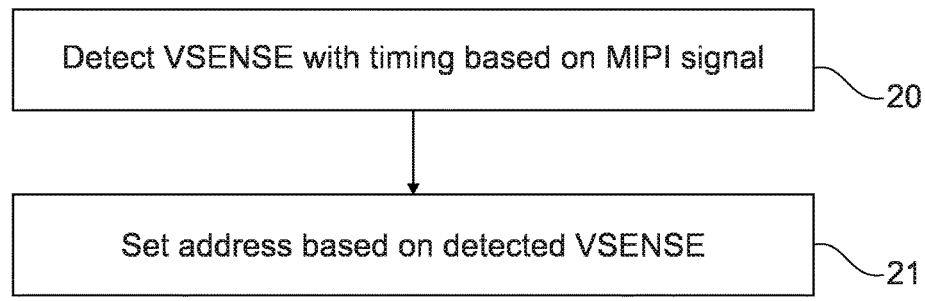
FIG. 2 is a flowchart illustrating a method according to some embodiments.

FIG. 2 is a flowchart of a method for address assignment to a MIPI RFFE device according to an embodiment, which may for example be implemented in the device of FIG. 10, but also may be implemented independently therefrom. In order to avoid repetitions, the method of FIG. 2 will be described referring to the description of FIG. 1 above.

At 20, the method includes detecting a voltage at a configuration terminal, like VSENSE at terminal 13D in FIG. 1, with a sense timing based on a MIPI RFFE signal received.

At 21, the method includes setting an address for a MIPI RFFE device like device 10 of FIG. 1 based on the detected voltage, for example based on a voltage level of VSENSE. For example, at 21 based on the detected VSENSE, an address from a group of more than two addresses, for example four addresses, may be selected.

Figure 3:
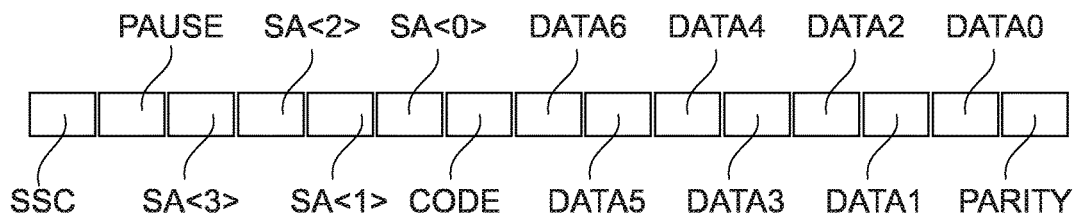
FIG. 3 is a schematic diagram illustrating the format of an example MIPI RFFE signal.

Next, the detection of VSENSE with a sense timing based on a MIPI RFFE signal according to various embodiments will be described referring to FIGS. 3-7. FIG. 3 an example MIPI RFFE signal which may be received for example by device 10 on third terminal 13C. Each block in FIG. 3 may represent one bit of data. The first bit is labeled SSC, may be sent on the data line of the bus and received at 13C, and indicates that a command is going to be sent as SDATA, together with clock signal SCLK. After that, a pause is followed by address bits SA<3> to SA<0>, a code bit, seven data bits and a parity bit.

Figure 4:
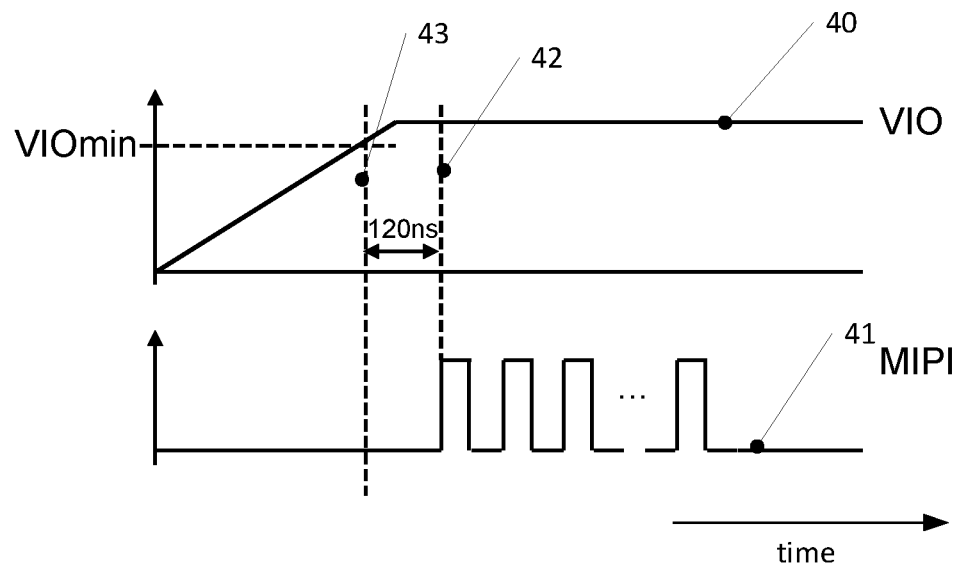
FIG. 4 is a diagram illustrating signals in a MIPI RFFE system at start-up.

FIG. 4 illustrates signals at a MIPI RFFE device at start-up. A curve 40 illustrates the supply voltage VIO. At start-up, the voltage VIO rises, until at a point in time denoted by a line 43 reaches a predefined minimum threshold $VIO_{min}$. At a point in time at least 120 ns afterwards, as indicated by a vertical line 42, a MIPI RFFE signal according to curve 41 may start, where curve 41 illustrates the MIPI RFFE clock signal SCLK alternating 0 and 1 values, which may be sent concurrently with the data signal shown in FIG. 3. In other words, at the point in time denoted by line 42, the first bit of the MIPI RFFE data signal, shown in FIG. 3, SSC, may occur.

Figure 5:
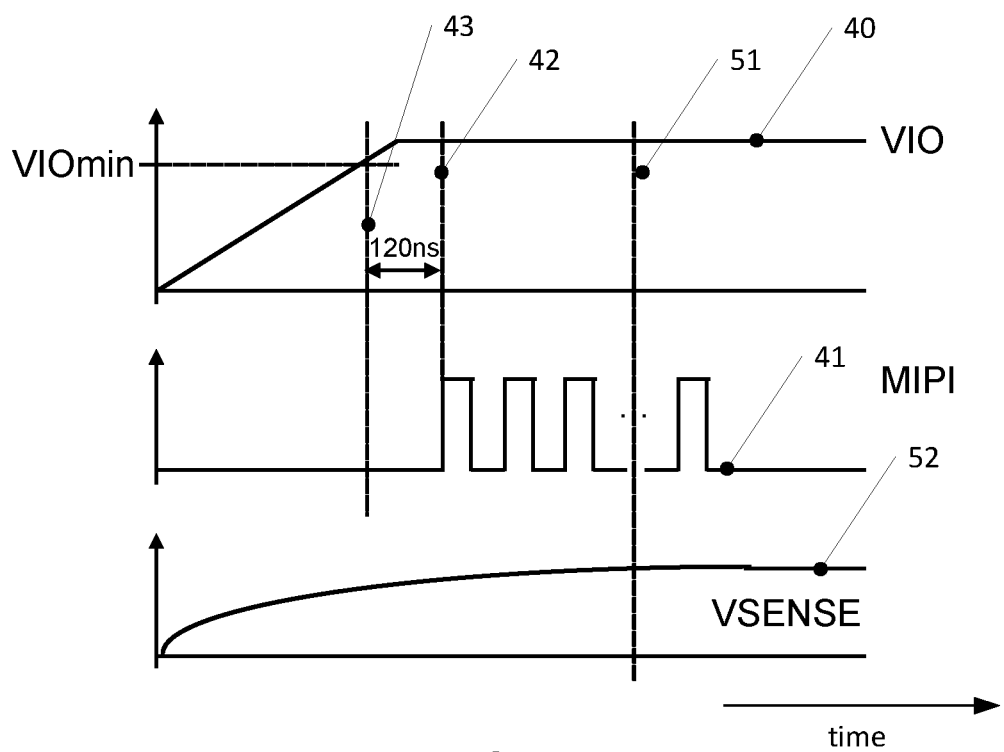
FIGS. 5, 6, and 7 are diagrams illustrating sense timing according to various embodiments.
Figure 6:
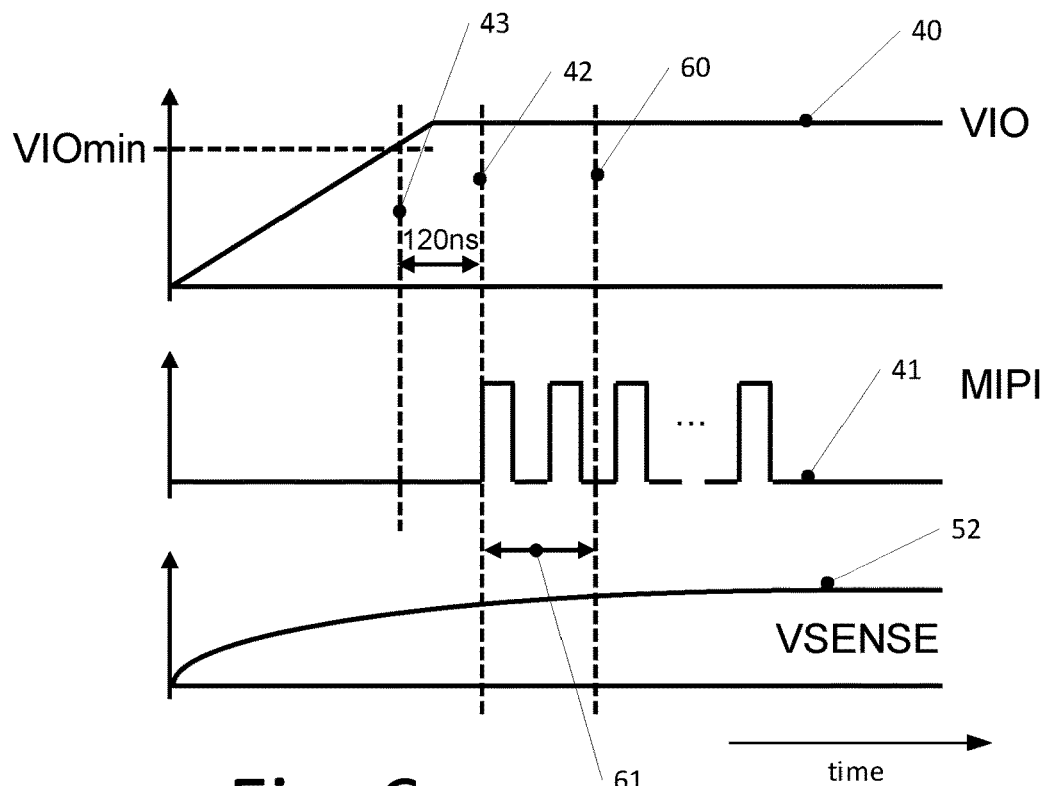
Figure 7:
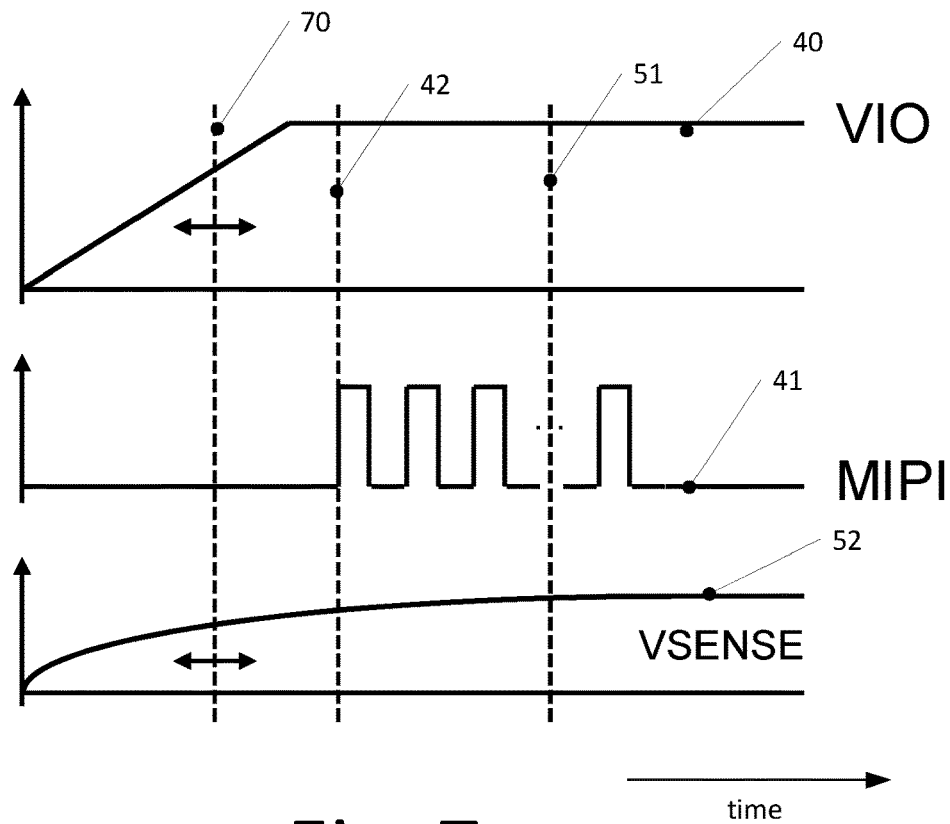

Sense timings according to different embodiments based on the MIPI RFFE signal including SCLK as illustrated by curve 41 will now be explained referring to FIGS. 5-7. Elements shown in FIGS. 5-7 which have already been explained with reference to FIG. 4 bear the same reference numerals and will not be described again. In addition to curves 40 and 41 of FIG. 4, each of FIGS. 5-7 illustrates a voltage VSENSE at a configuration terminal like fourth terminal 13D of FIG. 1 as a curve 52. As can be seen, at start-up VSENSE rises and over time assumes an essentially stationary value, which depends on a voltage applied externally to terminal 13D. Examples for such voltages will be explained later referring to FIG. 8. The time it takes voltage VSENSE to reach an essentially stationary level depends inter alia on capacitances coupled to the terminal, like $C_{par}$ and $C_{pad}$ of FIG. 1, and depending on implementation may also depend on other factors, for example on how fast the supply voltage VIO rises.

FIG. 5 illustrates a first sense timing usable in embodiments. In FIG. 5, a sense period for detecting voltage VSENSE starts at the beginning of the MIPI RFFE signal, for example with the SSC bit of FIG. 3, which in the example of FIG. 5 corresponds to the time marked by line 42. The sense period ends at a predefined clock of the MIPI RFFE clock signal SCLK. In other words, the sense period ends at an nth clock of the MIPI RFFE clock signal; "n" may be selected based on implementation. For example, in some MIPI RFFE implementations a device to which the address is to be assigned like device 10 has to have its address assigned after the first MIPI RFFE signal, such that it can execute a command send if it is addressed by the commands (for example if the bits SA<3> to SA<0> address the respective device). In some implementations, the shortest MIPI RFFE signal may include 12 clock signal periods. In this case, "n" is selected to be smaller than 12, for example n=8, which ensures that the address assignment is complete when the address is needed. In FIG. 5, this is symbolized by a vertical line 51, i.e. the sense period starts at the time denoted by line 42 corresponding to the beginning of the MIPI RFFE signal, and ends at the nth clock as symbolized by vertical line 51. As can be seen, at the time indicated by vertical line 51, VSENSE according to curve 42 has approximately reached its stationary value, which allows for a reliable sensing.

In the embodiment of FIG. 5, therefore the sense period starts with a feature of the MIPI RFFE signal (in this case, the first bit, SSC, or first clock of the MIPI RFFE data signal), and ends with a feature of the MIPI RFFE signal (in this case, the n-th clock of the MIPI RFFE clock signal). Instead of starting with the SSC bit, in other embodiment the sense period could also start with a different feature, for example the second clock of the MIPI RFFE clock signal.

A second sense timing usable in embodiments is shown in FIG. 6. As in FIG. 5, the sense period starts at the beginning of the MIPI RFFE signal, corresponding to vertical line 42. The sensing stops after a predefined delay 61, indicated by an arrow after the start, as indicated by a vertical line 60. Also in this case, VIO is almost stable and VSENSE has almost reached its stationary value. The predefined delay 61, in the example above, is selected to be smaller than 12 clock periods, such that also in this case the address is assigned before the end of the MIPI RFFE command.

In FIG. 6, the sense period starts with a feature (in example of FIG. 6 the beginning of) the MIPI RFFE signal, and ends a predefined time after this feature. Also here, instead of the SSC bit, another feature, like for example the second clock, may be used.

A third sense timing usable in some embodiments is shown in FIG. 7. Here, as indicated by a vertical line 70, the start of the sense period may be some time during the rise of VIO, for example when VIO reaches a certain threshold value. In some embodiments, the start may coincide with VIO reaching $VIO_{min}$, i.e. vertical line 43. In other words, in this case the start of sensing does not depend on the MIPI RFFE signal. The end of sensing is then at an n-th clock of the MIPI RFFE signal, as in case of FIG. 5, and marked in FIG. 7 also with vertical line 51 as in FIG. 5. This end of the sense period ensures that VSENSE has approximated a stable value.

In FIG. 7, the sense time starts depending on the slope, but ends with a feature of the MIPI RFFE signal, in this case the n-th clock.

The above discussed sense timing based on the MIPI RFFE signal in FIGS. 5-7 in implementations ensures that the voltage to be sensed for address assignment, VSENSE, is essentially stable, and also VIO has reached essentially a stable value. In implementations, this allows a more reliable sensing compared to approaches where the sensing starts at some point during the rise of VIO (similar to FIG. 7 at line 70) and then ends a predefined delay after that, as then both beginning and end of the sensing depend on the slope of VIO, and depending on how fast voltage VIO rises no stable values of VSENSE and VIO may be reached during the sense period, which may lead to inaccurate sensing.

Figure 8:
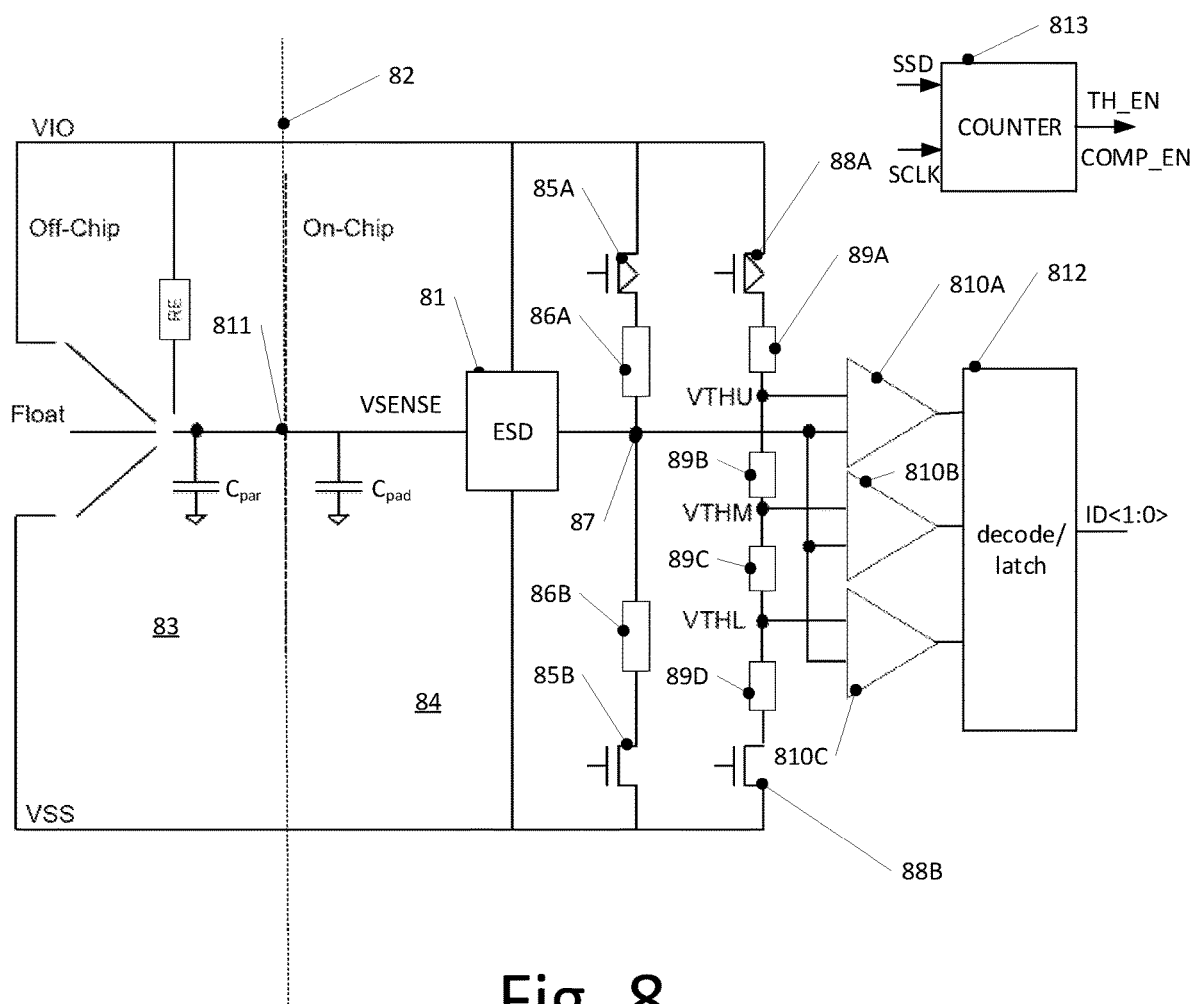
FIG. 8 is a circuit diagram of a MIPI RFFE device according to an embodiment.

FIG. 8 is a circuit diagram illustrating sense circuitry and application of different voltages VSENSE for address assignment according to an embodiment. The sense circuitry may for example be used as sense circuitry 12 of FIG. 1.

A line 82 in FIG. 8 divides off-chip circuitry 83 used for applying a voltage VSENSE and on-chip circuitry 84 including the sense circuitry, which may be included in a device like device 10 of FIG. 1.

The embodiment of FIG. 8 supports setting of four different addresses. To achieve this, a configuration node 811, which may correspond to fourth terminal 13D of FIG. 1, may be coupled to supply voltage VIO directly for setting a first address, may be connected to VIO via a resistor RE for setting a second address, may be left floating (float) for setting a third address or may be coupled to ground VSS for setting a fourth address. In other embodiments, more than four or less than four different couplings of configuration node 811 may be used to generate a voltage VSENSE to be sensed. In yet other embodiments, a voltage for setting the address may be applied to configuration node 811 directly from a voltage source independent from VIO and VSS.

The on-chip part of FIG. 8 includes ESD protection circuitry 81 protecting the chip against electrostatic discharge (ESD) events at the configuration node 811. Any conventional ESD protection circuitry may be used, for example diodes or other circuit elements which become conducting when a voltage at configuration node 811, thus shunting the voltage to ground VSS or to the positive supply voltage VIO (depending on the sign of the voltage). Such a high voltage may for example be due to an ESD event.

ESD protection circuitry 81 may also contribute to the capacitance $C_{pad}$, for example due to capacitances of diodes or other elements used in the ESD protection circuitry.

Other than from possibly providing a parasitic capacitance, ESD protection circuitry 81 does essentially not influence the behavior of the device shown in normal operation, i.e. outside ESD or other high voltage elements.

In the device of FIG. 8, at power on, as soon as VIO is sufficiently high (for example as soon as VIO reaches the value $VIO_{min}$ shown in FIG. 4), transistors 85A, 85B are switched on to become conducting between respective source and drain terminals (in case of field effect transistors) or collector and emitter terminals (in case of bipolar transistors or insulated gate bipolar transistors). This connects an internal sense node 85 to VIO via a resistor 86A and to VSS via a resistor 86B. This way, internal sense node 87 is charged with the voltage VSENSE. In other embodiments, a voltage to be sensed may be applied directly to internal sense node 87. Resistors 86A, 86B are selected to allow a sufficiently fast charging so that VSENSE is essentially settled at internal sense node 87 at the end of the sense period. Values depend on the parasitic capacitances $C_{par}$ allowed or expected. The higher $C_{par}$ is, the larger a current flow via resistors 86A, 86B needs to be, so smaller values for the resistors 86A, 86B then have to be chosen. Example values are $C_{par}$ smaller than 5 pF and a current flow smaller than 10 µA, but this depends on implementation.

At this time, transistors 88A, 88B are still switched off.

With the beginning of the sense period (for example at the SSC bit as indicated by lines 42 in FIGS. 5 and 6 or at the point in time in the slope as indicated by line 70 in FIG. 7), transistors 88A, 88B are switched on. This generates threshold voltages VTHU, VTHM and VTHL by a resistive divider formed by resistors 89A, 89B, 89C and 89D. These threshold voltages are selected such that they are between the four different possible input voltages at configuration node 811, explained above (VIO, VSS, floating or VIO via resistor RE). In case of the sense period beginning with the SSC bit, the SSC bit may trigger a counter 813, which then outputs a signal TH_EN switching transistors 88A, 88B on. In case of FIG. 7, instead of signal SSD the counter may be started by VIO exceeding a predefined threshold.

The voltage at internal sense node 87 is provided to first inputs of comparators 810A, 810B and 810C. Second inputs of comparators 810A, 810B and 810C are supplied with the threshold voltages VTHU, VTHM and VTHL, respectively. At the end of the sense period (for example at the n-th clock signal in case of FIGS. 5 and 7 or after predefined delay 61), comparators 810A, 810B, 810C are enabled to perform the comparison of the voltage at internal sense node 87 with the respective threshold voltage VTHU, VTHM and VTHL and output the result to a decode/latch circuit 812. In case of using the n-th clock, counter 810 counts starting from SSD (or VIO exceeding a threshold) based on SCKL and outputs a comparator enable signal to COMP_EN to enable comparators 810A, 810B, 810C after the n-th clock has been reached. In case of an analog delay as in FIG. 6, instead of a counter an analog delay circuit triggered by SSD or another feature of the MIPI RFFE signal may be used.

Decode/latch circuit 812 receives the outputs from comparators 810A, 810B and 810C and outputs an ID value, in this case a 2-bit value, indicating one of four addresses to be used. When the voltage at internal sense node 87 exceeds VTHU, a first value of ID is output, if the voltage is between VTHU and VTHM (for example corresponding to VIO being applied via RE), a second value of ID is output, when the voltage at internal sense node 87 is between VTHM and VTHL (for example configuration node 811 left floating), a third value of ID is output, and when the voltage is below VTHL (for example corresponding to configuration node 811 coupled to VSS), a fourth value of ID is output. In embodiments, this value is latched, i.e. it remains being output irrespective of any changes at the configuration node 811. Based on signal ID, then in this case one of four predefined addresses is used for the MIPI RFFE device 10 of FIG. 1. After this address determining process, the sense circuitry is switched off, e.g. transistors 85A, 85B, 88A and 88B as well as comparators 810A, 810B, 810C are switched off. Therefore, in embodiments, after the setting of the address apart from possible small leakage currents the sense circuitry does not contribute to the current consumption of the device.

The configuration with three parallel comparators of FIG. 8 is merely an example configuration, and any configuration enabling sensing of VSENSE at internal sense node 87 may be used, for example staggered comparator configurations, multi-level comparators and the like. Therefore, the specific circuit shown in FIG. 8 is not to be construed as limiting in any way.

Some embodiments are defined by the following examples:

Example 1. A method of address assigning for a MIPI RFFE device, comprising:
detecting a voltage at a configuration terminal of the MIPI RFFE device with a timing based on a MIPI RFFE signal received by the MIPI RFFE device, and
setting the address of the MIPI RFFE device based on the detected voltage.

Example 2. The method of example 1, wherein detecting the voltage with a timing based on the MIPI RFFE signal includes starting a sense period for detecting the voltage based on a feature of the MIPI RFFE signal.

Example 3. The method of example 2, wherein the feature is an SSC bit of the MIPI RFFE signal.

Example 4. The method of example 2 or 3, wherein the sense period ends based on a further feature of the MIPI RFFE signal.

Example 5. The method of example 4, wherein the further feature is an n-th clock of a MIPI RFFE clock signal.

Example 6. The method of example 5, wherein "n" is smaller than a minimum length of a MIPI RFFE signal.

Example 7. The method of example 3 or 4, wherein the sense period ends a predefined time after the feature.

Example 8. The method of example 1 or 2, wherein detecting the voltage with a timing based on the MIPI RFFE signal includes detecting the voltage in a sense period, wherein the sense period ends at a feature of the MIPI RFFE signal.

Example 9. The method of example 8, wherein the feature is an n-th clock period of the MIPI RFFE signal.

Example 10. The method of example 9, wherein "n" is smaller than a minimum length of a MIPI RFFE signal.

Example 11. The method of any one of examples 8-10, wherein a start of the sense period is based on a rising of a supply voltage at start-up of the MIPI RFFE device.

Example 12. The method of any one of examples 2-11, wherein the method comprises activating comparator thresholds at the start of the sense period, and enabling a comparator arrangement configured to compare the voltage with the comparator thresholds at the end of the sense period, wherein setting the address based on the detected voltage comprises setting the address based on one or more outputs of the comparator arrangement.

Example 13. The method of any one of examples 1-12, wherein the MIPI RFFE signal is a first MIPI RFFE signal after start-up of the MIPI RFFE device.

Example 14. A MIPI RFFE device, including sense circuitry configured to:
detect a voltage at a configuration terminal of the MIPI RFFE device with a timing based on a MIPI RFFE signal received by the MIPI RFFE device,
set an address of the MIPI RFFE device based on the detected voltage.

Example 15. The device of example 14, wherein the device is configured to perform the method of any one of examples 1-13.

Example 16. The device of example 14 or 15, wherein the sense circuitry is configured to, for detecting the voltage with a timing based on the MIPI RFFE signal, to starting a sense period for detecting the voltage based on a feature of the MIPI RFFE signal.

Example 17. The device of example 16, wherein the feature is an SSC bit of the MIPI RFFE signal.

Example 18. The device of example 16 or 17, wherein the sense circuitry is configured to end the sense period based on a further feature of the MIPI RFFE signal.

Example 19. The device of example 18, wherein the further feature is an n-th clock of a MIPI RFFE clock signal.

Example 20. The device of example 19, wherein "n" is smaller than a minimum length of a MIPI RFFE signal.

Example 21. The device of example 16 or 17, wherein the sense circuitry is configured to end the sense period a predefined time after the feature.

Example 22. The device of any one of examples 14 to 16, wherein the sense circuitry is configured to, for detecting the voltage with a timing based on the MIPI RFFE signal, detect the voltage in a sense period, wherein the sense period ends at a feature of the MIPI RFFE signal.

Example 23. The device of example 22, wherein the feature is an n-th clock period of the MIPI RFFE signal.

Example 24. The device of example 23, wherein "n" is smaller than a minimum length of a MIPI RFFE signal.

Example 25. The device of any one of examples 22-24, wherein the sense circuitry is configured to start the sense period based on a rising of a supply voltage at start-up of the MIPI RFFE device.

Example 26. The device of any one of examples 16-25, wherein the sense circuitry comprises a comparator arrangement configured to compare the voltage to a plurality of comparator thresholds, wherein the sense circuitry is configured to activate the comparator thresholds at the start of the sense period, and to enable the comparator arrangement at the end of the sense period, and to set the address based on one or more outputs of the comparator arrangement.

Example 27. The device of any one of examples 14-26, wherein the MIPI RFFE signal is a first MIPI RFFE signal after start-up of the MIPI RFFE device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of address assigning for a mobile industry processor interface (MIPI) radio frequency front end (RFFE) device, comprising:
   detecting an address voltage at a configuration terminal of the MIPI RFFE device, including:
      detecting both an increasing slope and a first minimum voltage of a supply voltage to the MIPI RFFE device to determine a start time of a sense period;
      determining a stop time of the sense period at an n-th clock of a MIPI RFFE clock signal that begins after the start time, where n is selected to be smaller than a minimum length of the MIPI RFFE clock signal such that the stop time occurs while the MIPI RFFE clock signal is active;
   measuring the address voltage at the stop time; and
   determining an MIPI RFFE address of an MIPI RFFE device based on the address voltage measured.

2. The method of claim 1, wherein the increasing slope is indicative of the supply voltage at start-up of the MIPI RFFE device.

3. The method of claim 1, wherein the method further comprises applying a first comparator threshold to determine the start time.

4. The method of claim 1, wherein the MIPI RFFE clock signal begins at an SSC bit after start-up of the MIPI RFFE device.

5. A mobile industry processor interface (MIPI) radio frequency front end (RFFE) device, configured to:
   detect an address voltage at a configuration terminal of the MIPI RFFE device including:
   detecting both an increasing slope and a first minimum voltage of a supply voltage to the MIPI RFFE device to determine a start time of a sense period;
   determining a stop time of the sense period at an n-th clock of a MIPI RFFE clock signal that begins after the start time, where n is smaller than a minimum length of the MIPI RFFE clock signal such that the stop time occurs while the MIPI RFFE clock signal is active;
   measuring the address voltage at the stop time; and
   determining an MIPI RFFE address of an MIPI RFFE device based on the address voltage measured.

6. The method of claim 1, wherein n is predetermined based on a difference between the address voltage and a VSENSE voltage value being less than a second minimum voltage as an indication that the address voltage is essentially stable.

7. The method of claim 1, wherein the address voltage is uniquely indicative of a VSENSE voltage value for a value of n.

8. The method of claim 1, wherein the first minimum voltage is less than the supply voltage.

9. The device of claim 5, wherein the increasing slope is indicative of the supply voltage at start-up of the MIPI RFFE device.

10. The device of claim 5, wherein a first comparator threshold is applied to determine the start time.

11. The device of claim 5, wherein the MIPI RFFE clock signal begins at an SSC bit after start-up of the MIPI RFFE device.

12. The device of claim 5, wherein n is predetermined based on a difference between the address voltage and a VSENSE voltage value being less than a second minimum voltage as an indication that the address voltage is essentially stable.

13. The device of claim 5, wherein the address voltage is uniquely indicative of a VSENSE voltage value.

14. The device of claim 5, wherein the first minimum voltage is less than the supply voltage.

15. The device of claim 5, wherein the address voltage is uniquely indicative of a VSENSE voltage value for a value of n.

16. A mobile industry processor interface (MIPI) core comprising a processor configured to:
   detect an address voltage at a configuration terminal of a MIPI radio frequency front end (RFFL) device, further comprising:
   detecting both an increasing slope and a first minimum voltage of a supply voltage to the MIPI RFFE device to determine a start time of a sense period;
   determining a stop time of the sense period at an n-th clock of a MIPI RFFE clock signal that begins after the start time, where n is smaller than a minimum length of the MIPI RFFE clock signal such that the stop time occurs while the MIPI RFFE clock signal is active;
   measuring the address voltage at the stop time; and
   determining an MIPI RFFE address of an MIPI RFFE device based on the address voltage measured.

17. The MIPI core of claim 16, wherein the increasing slope is indicative of the supply voltage at start-up of the MIPI RFFE device.

18. The MIPI core of claim 16, wherein a first comparator threshold is applied to determine the start time.

19. The MIPI core of claim 16, wherein the MIPI RFFE clock signal begins at an SSC bit after start-up of the MIPI RFFE device.

20. The MIPI core of claim 16, wherein the first minimum voltage is less than the supply voltage.

* * * * *